United States Patent [19]

Scholten et al.

[11] Patent Number: 4,683,654

[45] Date of Patent: Aug. 4, 1987

[54] METHOD OF AND DEVICE FOR SENSING THE PRESENCE OR ABSENCE OF AN ARTICLE AT THE END OF A VACUUM PICK-UP MEANS

[75] Inventors: Gerard J. Scholten; Theodorus J. G. Beurskens; Mathias F. Videc, all of Eindhoven, Netherlands

[73] Assignee: U.S. Philips Corporation, New York, N.Y.

[21] Appl. No.: 852,091

[22] Filed: Apr. 14, 1986

Related U.S. Application Data

[63] Continuation of Ser. No. 600,198, Apr. 13, 1984, abandoned, which is a continuation of Ser. No. 441,579, Nov. 15, 1982, abandoned.

[30] Foreign Application Priority Data

Apr. 13, 1982 [NL] Netherlands .......................... 8201532

[51] Int. Cl.⁴ ........................ H05K 3/30; B23P 19/00; G01M 3/02
[52] U.S. Cl. ........................................ 29/832; 29/740; 73/37; 414/744 B; 414/752
[58] Field of Search .......................... 29/832, 714, 740; 73/37; 116/137 R, 266; 221/211; 156/578; 414/752

[56] References Cited

U.S. PATENT DOCUMENTS

| | | |
|---|---|---|
| 3,731,867 | 5/1973 | Frisbie et al. . |
| 4,033,173 | 7/1977 | Firdaus . |
| 4,116,348 | 9/1978 | Atchley et al. . |
| 4,215,646 | 8/1980 | Williams . |
| 4,221,533 | 9/1980 | Heim et al. ...................... 414/744 B |
| 4,252,076 | 2/1981 | Williams . |
| 4,261,681 | 4/1981 | Gates .............................. 414/744 B |
| 4,292,116 | 9/1981 | Takahashi et al. . |
| 4,372,802 | 2/1983 | Harigane et al. . |

FOREIGN PATENT DOCUMENTS 56-87336 7/1981 Japan .

Primary Examiner—Mark Rosenbaum
Assistant Examiner—Carl J. Arbes
Attorney, Agent, or Firm—Norman N. Spain

[57] ABSTRACT

A method of and a device for sensing the presence or absence of an electrical or electronic component at the end of a vacuum pick-up means. In the absence of a component, the air flow produced by the vacuum is converted into an acoustic signal which indicates the absence of the component.

7 Claims, 7 Drawing Figures

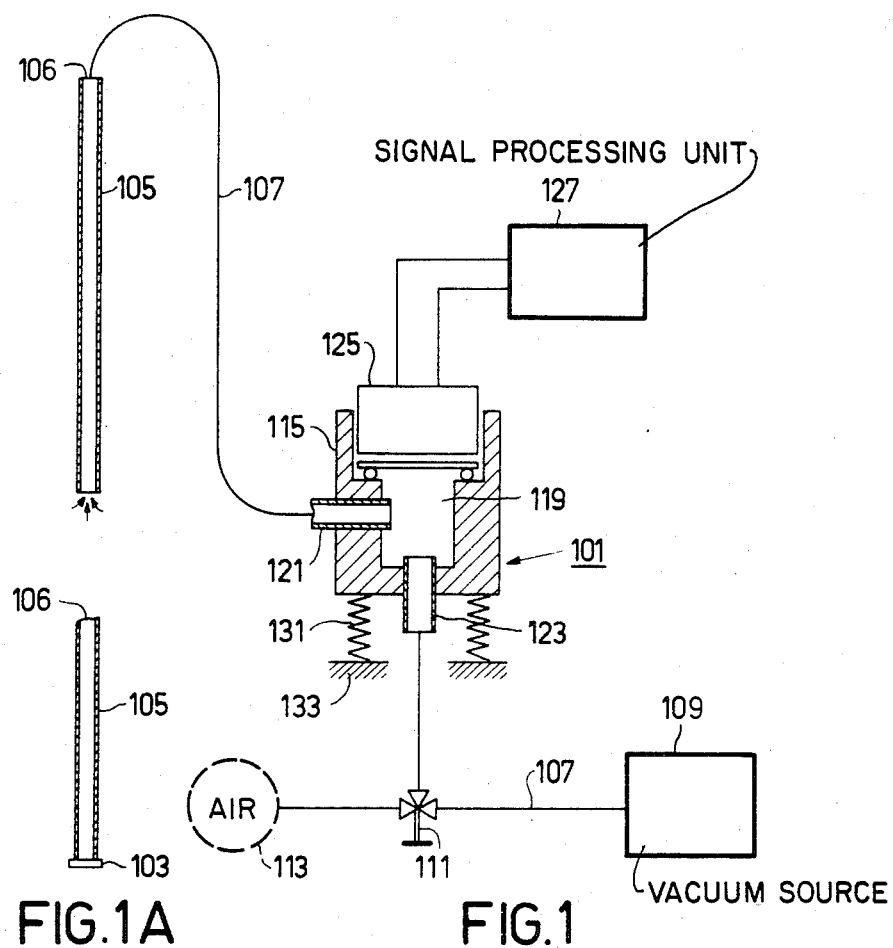
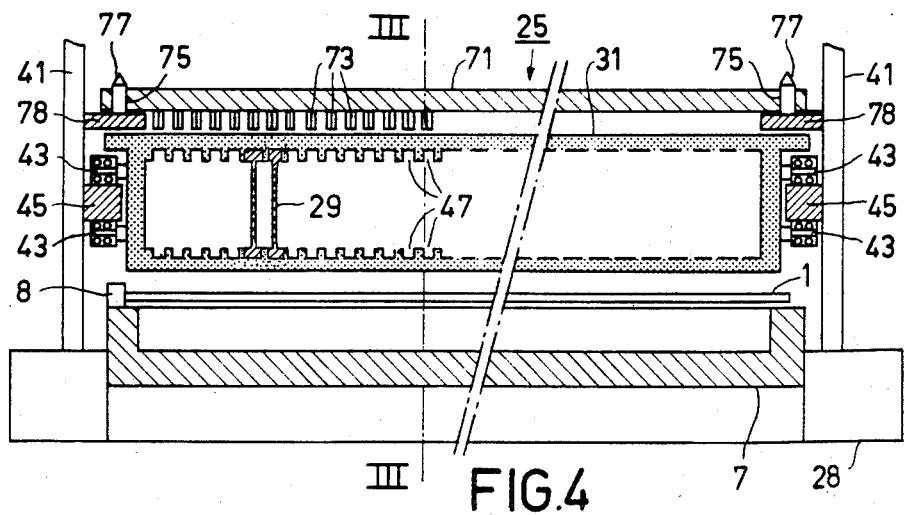

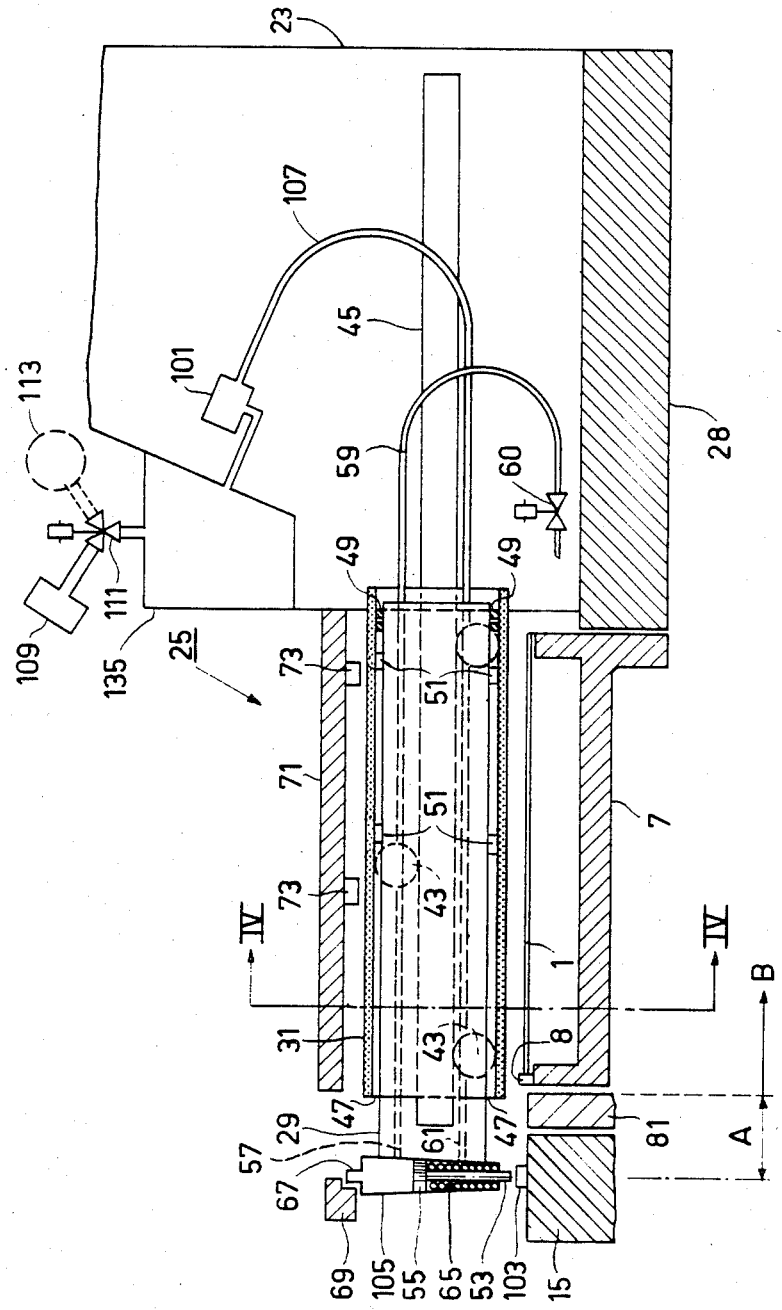

METHOD OF AND DEVICE FOR SENSING THE PRESENCE OR ABSENCE OF AN ARTICLE AT THE END OF A VACUUM PICK-UP MEANS

This is a continuation of application Ser. No. 600,198, filed Apr. 13, 1984, said application Ser. No. 600,198 and now abandoned in turn being a continuation of application Ser. No. 441,579 filed Nov. 15, 1982 and now abandoned.

BACKGROUND OF THE INVENTION

1. Field of the Invention

The invention relates to a method of sensing the presence or absence of an article at the end of a vacuum pick-up means which is connected to a vacuum source for the picking up, transport and placement of an article, the article being picked up and retained by the pick-up means under the influence of the vacuum and being released when the vacuum is interrupted or removed, the difference in the vacuum occurring in the presence and the absence of the article being used to generate a test signal.

2. Description of the Prior Art

For the picking up, transport, transfer and placement of articles by means of vacuum pick-up means it is desirable, if not necessary, to know:

a. that the article has indeed been attracted and picked up by the pick-up means;

b. that the article remains attached to the pick-up means over the entire transport path until the instant at which the article is placed;

c. that the article has indeed been placed and left behind in the appropriate location.

Detection and sensing of the presence or absence of an article at the end of the pick-up means can be performed in various ways, for example, by direct detection by means of sensors, by detection of a relative displacement of the pick-up means by mechanical means or by optical means, or by indirect detection by means of a pressure detector or a flowmeter.

A method of the kind set forth is known from U.S. Pat. No. 3,453,714, which discloses an indirect detection method utilizing a diaphragm which reacts to a difference in vacuum. A further indirect method which utilizes a differential pressure switch is known from U.S. Pat. No. 4,116,348. Detection on an optical basis by means of a photocell (again an indirect method) is known from U.S. Pat. No. 3,731,867. Finally, European patent application No. 36.826 discloses a detection method which utilizes a pressure detector as well as an optical detection method. The known detection methods either use a displaceable member and/or react to a differential pressure.

SUMMARY OF THE INVENTION

The present invention has for its object to improve the known detection methods to accelerate the detection process itself, and to enhance the reliability of the detection.

This object is achieved in accordance with the invention mainly in that the air flow which is produced by the vacuum in the absence of an article is used to generate the test signal, said air flow being converted into an acoustic signal which indicates the absence of the article.

Using the method in accordance with the invention, fast detection is achieved in a simple manner, the intensity of the acoustic signal generated, a whistling or a noise signal being a measure for the amplitude of the signal and also a measure for the amount of air flowing through. When the vacuum is switched on, a maximum air flow and hence a maximum sound signal is to be expected when the free end of the pick-up means is not closed by an article. i.e. when no article is present; the air flow and hence the sound signal are minimum when the pick-up means is closed by an article present.

The article to be picked up and transported may have a variety of dimensions; for articles having comparatively large dimensions, of the order of magnitude of decimeters, several pick-up means are used; for smaller articles having dimensions of the order of magnitude of millimeters, a single pick-up means will suffice.

The acoustic signal can be generated by means of a whistle or noise generator arranged in the air flow. However, according to a preferred method in accordance with the invention, the acoustic signal is produced by turbulences created in the air flow.

The acoustic signal is preferably amplified.

In a further preferred method in accordance with the invention, the acoustic signal is converted into an electric, electronic and/or optical signal.

The invention can be used particularly advantageously for the picking up, transport and placement as well as for the treatment and handling of electronic and/or electrical components in general.

The increasing degree of miniaturization in the electronics industry has given rise to the development of plate-shaped, block-shaped or cylindrical components without connection wires which are also referred to as "chip-type" components. These components have comparatively small dimensions of the order of magnitude of millimeters; for example, a frequently used component has the standard dimensions $3.2 \times 1.6 \times 0.8$ millimeters. For the placement of such chip-type components on a substrate, the components are presented in a given position, packed in a given package or not, and are picked up by a transfer member in order to be deposited on the track side of the substrate in the appropriate location; the components are retained in position by means of a fixing agent, such as solder paste or glue, applied to the substrate and/or the components in advance; subsequently, the components are soldered in position by means of a suitable process. Components comprising short connection members, such as diodes or transistors, are transferred to and placed on the substrate in the same manner. Considering the small dimensions of said components, the dense track pattern on the substrate and the required accurate positioning of the components on the substrate, such components can no longer be transported, transferred and placed by means of purely mechanical gripping means such as customarily used for the handling of conventional components comprising connection wires. For the handling of chip-type components, generally use is made of vacuum pick-up means which are connected to a vacuum source and by means of which a component is picked up in a pick-up position, from a given package or not, after which the pick-up means with the attracted component is displaced to the mounting position over a substrate and ultimately the component is placed on the substrate by the pick-up means and is retained thereon by a fixing agent, for example, glue or solder paste applied to the substrate and/or the component in advance. After removal of the vacuum, the pickup means is moved to the pick-up position again, after which a further component can be picked up and a new cycle may commence.

The invention can also be particularly attractively used for a method for placing electrical and/or electronic components on a substrate in which each component is transferred from a pick-up position to a placement position on the substrate by means of a vacuum pick-up means; this method in accordance with the invention is characterized in that the picking up of each component in the pick-up position and the placement of the component on the substrate are checked by means of the described sonic detection method.

When a comparatively large number of components are to be placed, for example, some tens of components on the same substrate, it is absolutely necessary to be certain that the components are indeed picked up, transported and placed. If a single component is not picked up or not actually left behind on the substrate, the mounting process is liable to be disturbed and an inadmissible rejection percentage may occur; also inadmissible uncertainty arises as regards the reliable execution of the mounting process. These problems and uncertainties are avoided by using the sonic detection method in accordance with the invention.

In this context a substrate is also to be understood to mean, for example, a tape-like package strip with cavities, chambers or cut-outs in which the components are accommodated. By using the method in accordance with the invention for the packaging of components, it is ensured that each cavity, chamber or cut-out is actually provided with a component.

If desirable or necessary, of course, the presence of the component can also be checked just before it is placed on the substrate. Ir can thus be detected whether the component has fallen off the pick-up means during the transport from the pick-up position to the placement position.

The sonic detection method in accordance with the invention can also be attractively used for a mounting process when each component is temporarily brought to a standstill in an intermediate position during the transport from the pick-up position to the placement position, a fixing agent being applied to the component in said intermediate position; the presence of the component in the intermediate position is also checked by means of the described sonic detection method in accordance with the invention.

A substrate provided with components by means of the described mounting method is free from placement errors; such errors are to be understood to mean notably positions which are not provided with the component in the desired manner.

The invention also relates to a device for performing the described method, comprising at least one displaceable vacuum pick-up means which is connected to a vacuum source by means of a flexible connection, and an operable valve for establishing and interrupting the connection between the vacuum pick-up means and the vacuum source. The device in accordance with the invention is characterized in that a sound generator is inserted in the connection between the vacuum pick-up means and the vacuum source.

In one embodiment, the sound generator is constructed simply as a whistle. However, the sound generator in a preferred embodiment is constructed as a vortex chamber. The vortex chamber causes turbulences in the air flow produced by the vacuum, said turbulences being accompanied by sound and noise. It is not necessary to create a differential pressure by means of constrictions in this embodiment. Because such a simple sound or noise generator does not comprise moving parts and offers ample passages for the air flow without constrictions, the risk of breakdowns due to contamination is very small.

Because a microphone is arranged in the vortex chamber in a preferred embodiment of the device in accordance with the invention, the sound produced by the turbulent air flow can be simply converted into electronic signals.

In a preferred embodiment of the device in accordance with the invention, the microphone is connected to an electronic signal processing unit. This unit comprises, for example, a high-pass filter, an amplifier and a limit-value adjustment device for processing and converting the signals received via the microphone into "yes" and "no" signals which can influence the mechanical device via an electronic control unit. Disturbing sound signals from the environment which are not generated by the turbulent air flow may not be amplified and passed on; examples of such sounds are speech and music sounds in a frequency range of up to approximately 10,000 Hz. These sound signals are filtered out by the high-pass filter. Adjustment of a threshold value by means of the limit-value adjustment device enables adjustment of a minimum value of the signal whereto the sonic detector must still react. In the presence of a component at the end of the vacuum pick-up means, the sound is minimum; in the absence of a component, the sound is maximum; between a component and the vacuum pick-up means itself, however, same leakage occurs always, because the surface of the component is not absolutely smooth. This fact can be taken into account by adjustment of the threshold value.

Full benefit is derived from the advantages of the described sonic detector in combination with a device proposed in a previous patent application in the name of the assignee, this Ser. No. 345,881; filed Feb. 4, 1982; for a method of and device for positioning electrical and/or electronic components on a substrate, device for the placement of a number of electrical and/or electronic components on a substrate comprises a frame, a drive mechanism, a carrier for a substrate and a transfer mechanism with a number of vacuum pick-up means; such a device in accordance with the invention is characterized in that the vacuum pick-up means are connected to a common vacuum source via a single, common valve. Thanks to its simplicity and resultant reliability, the sonic detector is extremely suitable for multiple use, so that the reliability of the overall device is also improved while the costs of the sonic detector are low.

A preferred embodiment of the device in accordance with the invention is characterized in that is comprises a mechanism for the application of a fixing agent to the components, said mechanism comprising a number of applicator means which are displaceable between a rest position in which the applicator means can pick up a quantity of fixing agent and an active position in which they can be brought into contact with the lower side of the components. Thanks to the sonic detectors, any vacuum pick-up means which does not carry a component for some reason can be prevented from contacting one of the applicator means, so that the vacuum duct of the relevant vacuum pick-up means cannot become clogged by the fixing agent.

BRIEF DESCRIPTION OF THE DRAWINGS

The invention will be described in detail hereinafter with reference to the accompanying drawing. Therein:

FIG. 1 diagrammatically shows an embodiment of the detection device in accordance with the invention for sensing the presence of an article at the end of a vacuum pick-up means;

FIG. 1A shows a part of the pick-up means shown in FIG. 1;

FIG. 3 is a diagrammatic longitudinal sectional view, taken along the line III—III in FIG. 4, of a transfer device which forms part of the device shown in FIG. 2, the transfer device being shown in the pick-up position;

FIG. 4 is a cross-sectional view of the transfer device, taken along the line IV—IV in FIG. 3.

DESCRIPTION OF THE PREFERRED EMBODIMENT

Figure 2:
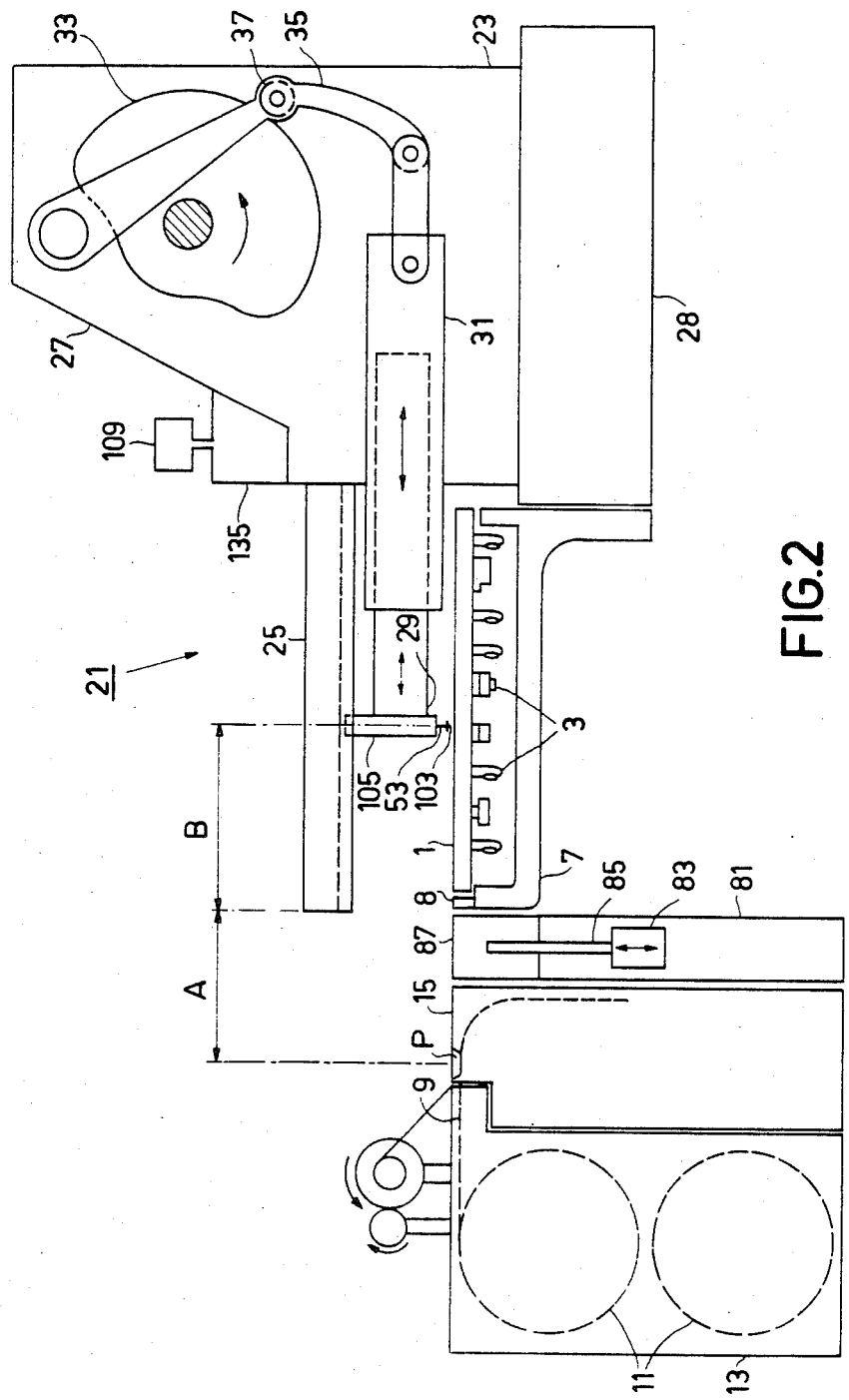
FIG. 2 diagrammatically shows an embodiment of a device for mounting electrical and/or electronic components on a substrate.
Figure 5:
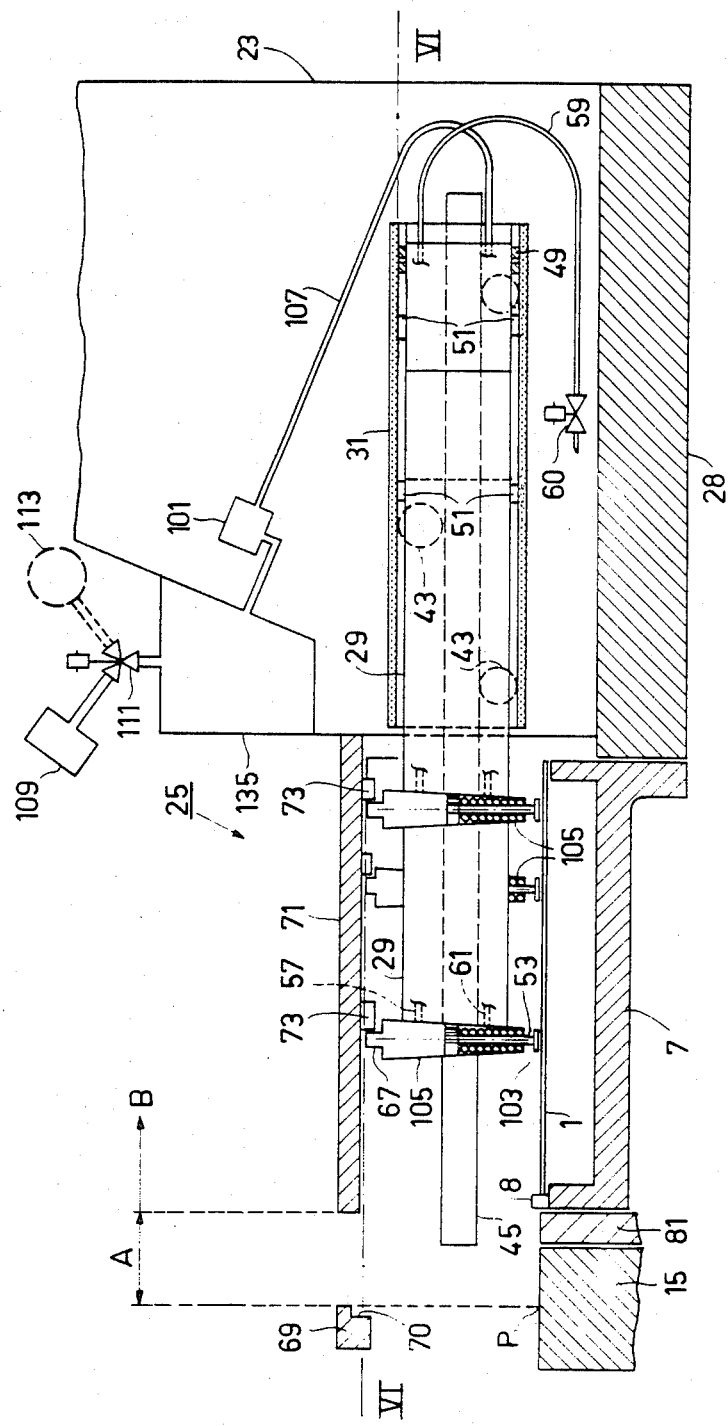
FIG. 5 is a sectional view, taken along the line V—V in FIG. 6, of the transfer device in the mounting position.
Figure 6:
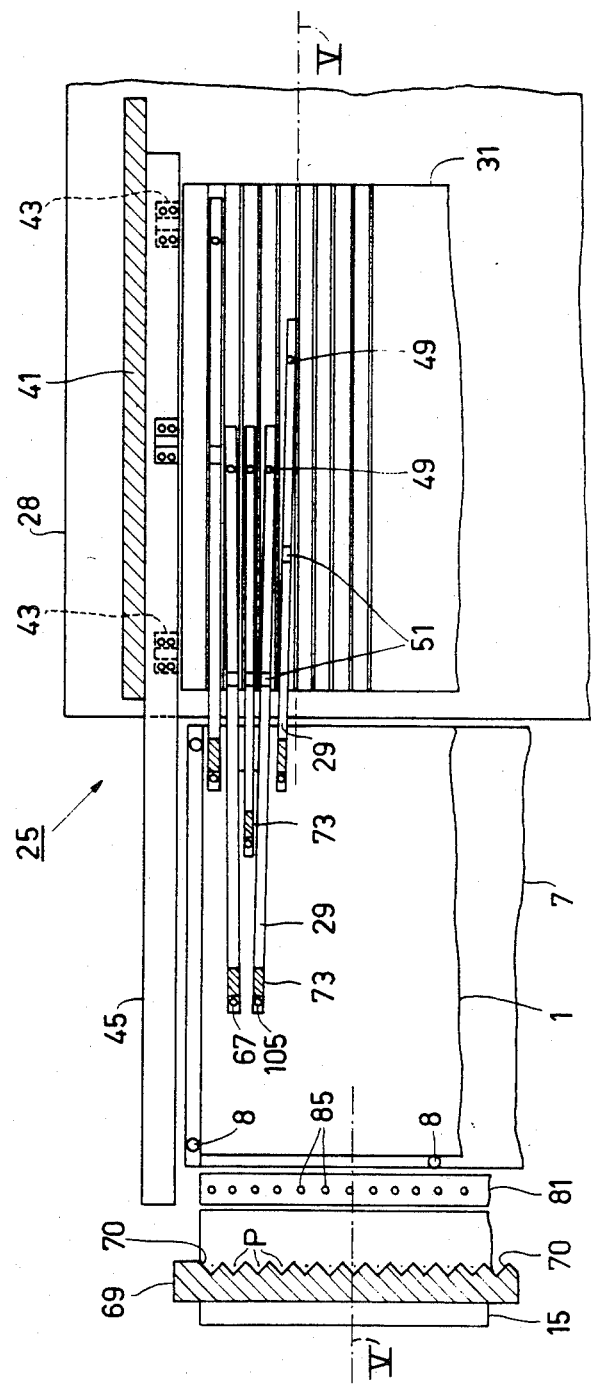
FIG. 6 is a sectional view, taken along the line VI—VI in FIG. 5, of the transfer device.

FIG. 1 diagrammatically shows a detection device 101 for sensing the presence of an article 103 at the end of a vacuum pick-up means 105 which comprises an air duct 106.

The pick-up means 105 is connected to a vacuum source 109 via a flexible tube 107. Via a valve 111, the pick-up means 105 can be connected to the vacuum source 109 to to the ambient atmosphere or a compressed air source 113. The detection device 101 operates on a sonic basis; to this end, it comprises a noise or sound generator 115 which consists of a vortex chamber 119 with an inlet 121 and an outlet 123 which extend at right angles to one another and which do not comprise a constriction. In the vortex chamber 119 there is arranged a microphone 125, preferably an electret microphone, which is connected to an electronic signal processing unit 127; this unit comprises, for example, a high-pass filter, an amplifier, a rectifier, a smoothing capacitor and a limit-value adjustment device; the "yes-no" signals of the latter device are applied to a control device in the form of optical, acoustic and/or electric signals. The sound generator 115 is mounted on a fixed base 133 by means of resilient or absorbing elements 131.

The operation of the sonic detection device is as follows: for the picking up, transporting and placement of an article 103, the vacuum pick-up means 105 is connected, via the valve 111, to the vacuum source 109, so that ambient air is drawn in via the free end which is not closed, so that an air flow is produced in the air duct 106 and the tube 107. When the free end of the pick-up means 105 is brought into the vicinity of or into contact with the article 103 to be picked up, the article is attracted due to the air flow and is retained by the prevailing pressure deficiency as shown in FIG. 1A. The article 103 can be transported to the desired location by displacement of the pick-up means 105. For the placement of the article in the desired location, the vacuum prevailing in the air duct 106 is removed by separating the pick-up means 105 from the vacuum source 109, by means of the valve 111, so that it communicates with the ambient atmosphere. If desirable or necessary, the pick-up means 105 may be connected to a compressed air source 113, so that the article 103 is removed from the pick-up means 105 in a positive manner, i.e. a forced manner. This effect may be important for the transport of very light articles. The situation where the pick-up means 105 is connected to the vacuum source 109 without the air duct 106 being closed by the article 103 for whatever reason is detected and signalled by the sound or noise generator 115. The air flow in the air duct 106 and the tube 107 is made to swirl in the vortex chamber 119 due to the acute, abrupt directional change from the inlet 121 to the output 123. The development of turbulences is accompanied by the development of sound or noise signals; these signals are received by the microphone 125 and are subsequently amplified by the electronic signal processing unit 127, after which they are futher processed for conversion into electric, acoustic, optical etc. signals. The filter prevents the passing on of additional sounds from the environment in an audible frequency range of up to approximately 10,000 Hz; such sounds are filtered out by the filter. Obviously, acoustic signals received by the microphone 125 can be processed to form a positive or a negative indication, i.e. the absence or presence, respectively, of an article at the end of the pick-up means is signalled in an optical, acoustic or other perceptible manner.

The embodiment shown in FIG. 1 concerns a sound detection device comprising a single pick-up means which is suitable for picking up a single article. For the picking up, transport and placement of larger articles, use can be made of a plurality of pneumatic pickup means, each of which comprises a sonic detection device in accordance with the invention, said devices being operated together or not.

The vacuum pick-up means 105 is constructed simply as a suction tube in the embodiment shown. Other embodiments can be used with the same advantages and with the same effect, for example, a vacuum pick-up means of the type comprising a pipette which is slidable in a tube.

In view of its reliability and the low susceptibility to breakdowns and contamination and its small dimensions, the sonic detection device in accordance with the invention can be used particularly advantageously in combination with a device for the placement and mounting of electrical and/or electronic components on a substrate as shown in the FIGS. 2 to 6.

The reference numeral 1 in FIG. 2 denotes a substrate, for example, a printed circuit board which is already provided on its lower side with conventional components 3, the lead of which are inserted in holes in the substrate. A large number of further components 103 which are very small and which do not have lead are to be placed on the upper side of the substrate. The dimensions of this type of component, also referred to as chips, are of the order of magnitude of millimeters and the components must be very accurately positioned on the substrate at a very small distance from one another. Customary dimensions are 3.2×1.6×0.8 mm. The substrate 1 is supported by a substrate carrier 7 which comprises positioning elements 8. The components 103 to be placed are packed in tapes 9 which comprise a perforation track, the components being loosely arranged in openings in the tapes which are closed at the lower side by a lower foil and at the upper side by a cover foil.

A number of these tapes is wound on reels 11 in a holder 13. The number of reels present in the holder 13 depends on the requirements. Customarily there are thirty-two reels which are rotatably arranged in two levels in the holder 13. The tapes 9 extend from the reels 11 to a device 15 (not described) for feeding the tapes to a given pick-up position P. Such a device 15 forms the subject of said previously filed applications, Ser. No. 345,881; filed Feb. 4, 1982, Ser. No. 399,042, filed July 16, 1982. This device has a 32-fold construction in this embodiment, so that thirty-two components 103 are presented during each cycle. The components 103 are removed from the tapes 9 by a transfer device 21 in order to be transferred to the substrate 1. The device 15 is constructed so that the tapes 9 can be fed to the pick-up position P together as well as individually. The transfer device 21 consists mainly of a frame 23, a transfer mechanism 25, a drive mechanism 27 and said substrate carrier 7. These parts are mounted on a base 28.

The transfer mechanism 25 which will be described with reference to the FIGS. 3 to 6 comprises a number of transfer arms 29 (thirty-two transfer arms in the present embodiment) which is equal to the number of components to be simultaneously transferred. Each transfer arm 29 comprises a vacuum pick-up means 105. The transfer arms 29 are mutually independently slidable in a single common carriage 31 which is slidable in the frame 23. The carriage is driven in a reciprocating manner by the drive mechanism 27 which is shown in FIG. 2 and which comprises a motor (not shown), a cam disc 33 and a lever 35 with a cam roller 37. The frame 23 consists mainly of two sidewalls 41 as shown in FIG. 4. The carriage 31 has a tubular form with a rectangular cross-section, during its reciprocating movement it is guided by rollers 43 whereby the carriage is journalled on two rails 45 which are mounted on the inner sides of the sidewalls 41 and which freely project from the frame 23 beyond the carrier 7. The carriage 31 is freely displaceable between the sidewalls 41. On the horizontal inner walls of the carriage there are provided parallel grooves 47, i.e. 32 grooves on each wall in the present embodiment. These grooves 47 serve for the slidable guiding of a corresponding number of transfer arms 29 in co-operation with ball bearings 49 and sliding blocks 51. The ball bearings 49, one on the upper side and one on the lower side of each transfer arm, serve to journal the transfer arms at their end without play. This method of journalling ensures that the vertical position of the transfer arms is maintained. The sliding blocks 51 are proportioned so that the transfer arms 29 exhibit some play in the transverse direction with respect to the carriage 31, the transfer arms then pivoting about the ball bearings 49 which define a vertical pivot axis. At its free end which is remote from the frame 23, each transfer arm 20 comprises a pneumatic pick-up means 105 which is of the type comprising a pipette in the embodiment shown. The pipette 53 is displaceable in the vertical direction (FIG. 3) by means of a piston 55. Each transfer arm 29 comprises a compressed air duct 57 which can be connected, via a flexible tube 59 and an electromagnetic valve 60, to a source of compressed air and which communicates with the space in the pick-up means 105 above the piston 55. The electromagnetic valves 60 can be separately actuated, so that the pipettes 53 can be individually displaced.

Furthermore, in each transfer arm 29 there is provided a vacuum duct 61 which communicates with the pipette 53 and which is connected, via the tube 107, to a vacuum source 109, in the manner already described with reference to FIG. 1, each vacuum duct 61 being connected via an acoustic detection device 101 and a common pneumatic chamber 135 whereto the vacuum source 109 and possibly also a compressed air source 113 is connected. The reference numeral 111 denotes the valve already mentioned with reference to FIG. 1. The pipette 53 is retained in the neutral rest position shown in FIG. 3 by means of a spring 65, the transfer arms 29 then being in their pick-up position and ready to pick up the components 103 which are in the pick up position P. In this position, the pick-up means 105 bear against an abutment bar 69 by way of a projection 67 on their upper end, said abutment bar comprising recesses 70 and serving as a multiple fixed abutment. The reference numeral 71 denotes a program plate which is mounted on the frame so as to be exchangeable and which comprises stops 73 which are engageable by the projections 67 on the pick-up means 105 so that the transfer arms 29 come to a standstill in the mounting position shown in FIG. 5. As is shown in FIG. 4, the program plate 71 is accurately positioned with respect to the frame 23 by means of locating holes 75 which co-operate with locating pins 77. The program plate 71 bears on two elongate supports 78 mounted on the sidewalls 41 of the frame 23.

The reference numeral 81 denotes a station for the application of a fixing agent or adhesive, such as solder paste or glue, to the lower side of the components. The station 81 comprises mainly an elongate arm 83 on which applicator means 85 are mounted in one row, the number of applicator means being equal to the number of components to be placed. The arm 83 with the means 85 is displaceable in the vertical direction from the rest position shown in FIG. 2, in which the means 85 are immersed in a container 87 with fixing agent, to an active position (not shown) in which the free end of the means 85 can be brought into contact with the lower side of the components to be placed.

The cycle of operation of the device will now be described. First, all thirty-two transfer arms 29 with the thirty-two pick-up means 105 have to be brought to their pick-up positions. To this end, the carriage 31 is moved towards the abutment bar 69 by the drive mechanism 27. The sliding blocks 51 run in the grooves 47 of the carriage 31 with an accurately defined friction. The friction is chosen so that when the carriage 31 is driven, the transfer arms 29 also move. However, as soon as the projection 67 of a transfer arm 29 contacts the abutment bar, the relevant arm with the pick-up means will remain stationary while the carriage 31 will continue, the sliding blocks 51 and the ball bearings 41 then running through the grooves 47 in the carriage 31.

During the displacement of the carriage 31 to the pick-up position, the transfer arms 29 move forwards until the projections 67 of all pick-up means 105 contact the fixed abutment bar 69, thus coming to a standstill in the pick-up position. The projections 67 and the recesses 70 in the abutment bar 69 are so shaped, proportioned and adjusted, that in the pick-up position of the transfer arms, the center lines of the pipettes 53 are situated exactly in one line over the pick-up positions P of the components which are presented in one line.

Subsequently, the pipettes 53 are displaced downwards by compressed air against the force of the springs 65, the compressed air being applied via the tubes 59 and the compressed air ducts 57 in the transfer arms 29 by operation of the valves 60; the components 103 present in the pick-up position P are picked up and retained by the pipettes 53 which are connected, via the vacuum ducts 61 and the tubes 107, to the pneumatic chamber 135 which is connected to the vacuum source 109 via the valve 111.

After termination of the supply of compressed air, the pipettes 53 are raised again by the springs 65 and the slide 31 is moved backwards, the transfer arms 29 being taken along again and the pick-up means 105 reach the entrance side of the program plate 71. All pick-up means 105 have thus travelled a first distance A according to a straight line, parallel to one another and over the same distance. As has already been described in detail in said previous assignee Ser. No. 345,881; filed Feb. 4, 1982; in the name of Applicant, at the entrance side of the program plate 71 there are also provided catchon elements (not shown) which lead to the front ends of flexible guide elements. The other end portion of each guide element is secured in an abutment block on the program plate 71 so that a pick-up means 105 is retained by the stop 73 in a mounting position exactly over the landing location of the component 103 to be placed on the substrate 1. The projections 67 on the pick-up means 105 are guided by the guide elements as far as the stops 73 whereagainst the transfer arms 29 come to a standstill again by way of the projections 67 on the pick-up means 105. The pick-up means have thus travelled a second distance B, with or without lateral displacement and over the same or different individual distances.

When all pick up means 105 have contacted the relevant stops 73, the pipettes 53 are moved downwards again by means of compressed air and the components 103 are placed on the substrate 1 by removal of the vacuum or by connection of the pipettes 53 to the compressed air source 113. Subsequently, the supply of compressed air is interrupted again and the pipettes 53 are raised by the springs 65. Finally, the carriage 31 is moved forwards again until all pick-up means 105 rest against the fixed abutment bar 69 again. In the meantime, all tapes 9 have been advanced one position, so that a next component is presented at each pick-up position P.

The detection and sensing of the presence of a component at the end of the pick-up means 105, of the correct picking up, of the trouble-free transport and of the correct placement of the components during the described cycle of operation are realized as follows:

The pick-up means 105 with the pipettes 53 are connected to the vacuum source 109 during the picking up of the components 103 and the transport thereof until they are left behind. A first presence detection is performed immediately after the picking up of the components. Should one of the pipettes 53 fail to pick up a component, for example, because no component is present in the relevant pick-up position P, detection and signalling by the associated acoustic detection device 101 already described with reference to FIG. 1 takes place. Via the control device forming part of the signal processing device 127, the drive for all tapes 9 is blocked, except for the tape 9 which is associated with the empty position and which is individually advanced one position in order to position a component 103 in the previously empty pick-up position P. The pick-up means 105 whose pipette 53 is still without a component is separately pneumatically actuated by actuation of the associated valve 60, so that the pipette performs a downward stroke and picks up the component, while the other pipettes remain in the upper position. After the raising of the pipette under the influence of the spring 65, the cycle is continued by all pick-up means together. Should several pick-up attempts fail, the device is stopped for further checking.

By performing a further presence detection at the instant at which the pick-up means are located in their placement positions over the substrate, it can be detected whether one of the pick-up means has lost its component during the transport from the pick-up position to the placement position. The absence of a component is detected and signalled again by the associated acoustic detection device 101 which prevents actuation of the relevant electromagnetic valve 60 via the signal processing unit 127; the empty pipette 53 remains in the upper position, while the remaining pipettes are displaced in order to place their component on the substrate. Subsequently, all pick-up means are returned to the pick-up position in which the next components in the position P. are picked up. The device then performs a mounting cycle during which, however, the sole component is placed on the substrate in the landing location which is still empty, while the other pipettes remain cut off from the compressed air supply and are not despatched. Subsequently, all pick-up means return to the pick-up position in which only the pipette which is then empty picks up a component, after which the mounting cycles are performed again in the customary manner.

The acoustic detection method can also be used to check whether the components have indeed been left behind on the substrate. If this is the case, a signal is supplied by all detection devices; if no signal is supplied for a pick-up means, either the component has not been left behind on the substrate or the pipette has become clogged; the correct operation of the microphones can be tested in this test situation.

In all cases where a component is not placed on the substrate in the desired manner for some reason, a single, next component is mounted as yet in the described manner during a next cycle.

For the fixation of the components to the substrate, an adhesive can be applied to the substrate, to the components or to both. The above test makes it possible to check whether adhesive is indeed present on the substrate and/or the component. In the presence of the adhesive, the components are normally retained on the substrate due to the viscosity of the adhesive, in spite of the vacuum in the pick-up means; indication of the presence of a component on one of the pick-up means by one of the acoustic detectors thus means that no adhesive was present on the relevant component and/or the substrate.

On the other hand, in order to ensure that all components are indeed left behind on the substrate, the pneumatic chamber 135 can be switched over, via the two-way valve 111, to the compressed air source 113 at the instant at which the components are placed on the substrate, so that the vacuum in the pick-up means 105 is removed and the pipettes 53 are purged; the components are thus ejected as if it were; at the same time, the pipettes 53 are purged.

In the described situations, pipettes which do not carry a component are separated from the supply of compressed air via the electromagnetic valves 60; this means that the pistons 55 which displace the pipettes 53 are retained in their upper rest position by the springs 65; the pipettes are thus prevented from contacting glue on the substrate, so that contamination and clogging of the pipettes are prevented. Equally effictively it is prevented that an empty pipette can come into contact with an applicator means 85 with adhesive in the station 81.

In the embodiment described and shown, the pipettes 53 are placed in the rest position and are retained therein by the springs 65; evidently, pneumatic means can also be used for this purpose.

What is claimed is:

1. A method of sensing the presence or absence of an article at the end of a vacuum pick-up means connected to a vacuum source for the pick-up, transport and placement of an article the article being picked up and retained by said pick-up means under the influence of the vacuum created by said vacuum source and being released when said vacuum is interrupted or removed by using the difference in the vacuum occurring in the presence and absence of said article at an end of said pick-up means to generate an acousitc test signal, comprising the steps of:

creating a turbulence in the air flow produced by said vacuum in the absence of said article, converting said turbulent air flow into an acoustic signal, amplifying said acoustic signal and then converting said amplified acoustic signal into an optical, electrical or further acoustical signal, said signal being indicative of the absence of said article on the end of said vacuum pick-up means.

2. The method of claim 1 in which an adhesive fixing agent is applied to each component in an intermediate position during the transfer of said components from the pick-up position to the placement position, further checking the presence of said component in said intermediate position, finally producing a signal responsive to the absence of said vacuum component on said vacuum pick-up means at said intermediate position, bringing said component into an adhesive applying position and applying adhesive to said component.

3. A method of placing an electrical and/or an electronic component on a substrate in which method said component is transferred from a pick-up position to a placement position on the substrate by means of a vacuum pick-up means connected to a vacuum source for the pick-up, said component being picked up and retained by the pick-up means under the influence of the vacuum created by said vacuum source and being released when said vacuum is interrupted or removed, said method including further steps of determining the retention or lack of retention of said component by said pickup-means and therefore the presence or absence of said component at said pick-up position and said placement position on said substrate by creating a turbulence in the air flow produced by said vacuum in the absence of said component being retained by said pick-up means and converting said turbulent air flow into an acoustic signal, amplifying said acoustic signal, processing said acoustic signal to remove undesired components of said acoustic signal, converting said thus amplified and processed acoustic signal into an electronic, visual or acoustic signal indicative of the lack of retention of said component by said pick-up means.

4. A device for positioning a number of electrical and/or electronic components on a substrate, said device comprising a frame to which are connected a carrier for said substrate and a transfer mechanism, comprising a number of vacuum pick-up means for transferring said components from a component pick-up position to a placement position on said substrate, a drive mechanism connected to said transfer mechanism for removing said tranfer mechanism between said pick-up position and said placement position on said substrate, and a single common valve connecting all of said vacuum pick-up means to a common vacuum source, and a vortex chamber for generating a sound position between said vacuum pick-up means and said common vacuum source.

5. The device of claim 4 comprising in addition a mechanism connected to said drive mechanism for the application of a fixing agent to said components and comprising a number of applicator means displaceable between the rest position in which the applicator means can pick-up a quantity of fixing agent and active position in which applicator means can be brought into contact with the lower side of the components.

6. A device for sensing the presence or absence of an article at the end of a vacuum pick-up means, which device has at least one displaceable vacuum pick-up means connected to a common vacuum source by means of a flexible connection, and a valve for establishing and interrupting the connection between said pick-up means and said common vacuum source, characterized in that a vortex chamber for generating an audible sound is positioned in said felxible connection.

7. The device of claim 6 characterized in that a microphone is arranged in the vortex chamber and that said microphone is connected to an electronic signal processing unit.

* * * * *